(12) United States Patent
Lin

(10) Patent No.: US 12,413,096 B2
(45) Date of Patent: Sep. 9, 2025

(54) WEARABLE DEVICE

(71) Applicant: Cheng Uei Precision Industry Co., LTD., New Taipei (TW)

(72) Inventor: Chin-Chung Lin, New Taipei (TW)

(73) Assignee: CHENG UEI PRECISION INDUSTRY CO., LTD., New Taipei (TW)

( * ) Notice: Subject to any disclaimer, the term of this patent is extended or adjusted under 35 U.S.C. 154(b) by 184 days.

(21) Appl. No.: 18/522,194

(22) Filed: Nov. 28, 2023

(65) Prior Publication Data

US 2024/0291317 A1    Aug. 29, 2024

(30) Foreign Application Priority Data

Feb. 23, 2023   (CN) .......................... 202320295974.1

(51) Int. Cl.
*H05K 5/00*   (2025.01)
*H02J 50/00*  (2016.01)

(52) U.S. Cl.
CPC ............ *H02J 50/00* (2016.02); *H05K 5/0086* (2013.01)

(58) Field of Classification Search
CPC .................................................. H05K 5/0086
See application file for complete search history.

(56) References Cited

U.S. PATENT DOCUMENTS

| | | | |
|---|---|---|---|
| 11,911,181 B1* | 2/2024 | Huttunen | A61B 5/683 |
| 2012/0212938 A1* | 8/2012 | Nguyen | F21L 4/00 |
| | | | 362/104 |
| 2018/0343989 A1* | 12/2018 | Mclear | G06K 19/07762 |
| 2020/0000345 A1* | 1/2020 | Connor | A61B 5/14532 |
| 2021/0037932 A1* | 2/2021 | Min | A61B 5/0006 |
| 2023/0389870 A1* | 12/2023 | Watts | A61B 5/6802 |
| 2025/0224767 A1* | 7/2025 | Haverinen | G06F 1/1698 |

* cited by examiner

*Primary Examiner* — Hung V Ngo
(74) *Attorney, Agent, or Firm* — Cheng-Ju Chiang

(57) ABSTRACT

A wearable device includes a housing, a main circuit board, two magnetic components and a battery. An inside of the housing has a ring-shaped accommodating space. The main circuit board is mounted in the accommodating space. The main circuit board includes a level section, a first curving section, a second curving section and two electrode contacts. A rear edge of a free side of the first curving section is recessed inward to form a notch. A rear edge of the first curving section is recessed inward to form a first reserving space. A rear edge of the second curving section is recessed inward to form a second reserving space. The two magnetic components are mounted in the accommodating space. The battery is accommodated in the accommodating space. The battery is received in the notch.

9 Claims, 8 Drawing Sheets

WEARABLE DEVICE

CROSS-REFERENCE TO RELATED APPLICATIONS

The present application is based on, and claims priority from, China Patent Application No. 202320295974.1, filed Feb. 23, 2023, the disclosure of which is hereby incorporated by reference herein in its entirety.

PRIOR ART

Referring to FIG. 7, a conventional wearable device is shown. The conventional wearable device is a ring shape. The wearable device is provided to be worn around a finger of a user for measuring parameters of physical characteristics of the user. The conventional wearable device includes a ring-shaped housing 10', and two magnetic contacts 30' mounted at an inner surface of the ring-shaped housing 10'. When the conventional wearable device is to be charged, the user may make a magnetic charger 50' attracted to the inner surface of the conventional wearable device to charge the conventional wearable device.

Referring to FIG. 7 and FIG. 8, an inside of the conventional wearable device is equipped with a circuit board 20'. The circuit board 20' has two through holes 21'. The two magnetic contacts 30' pass through the two through holes 21'. The two magnetic contacts 30' are soldered to the two through holes 21'. One side of the circuit board 20' defines a notch 22' to accommodate a battery 40'. Because the two magnetic contacts 30' of the conventional wearable device is disposed adjacent to the notch 22', a whole size of the two magnetic contacts 30' is limited by the battery 40', the two magnetic contacts 30' have no way of being disposed to be larger. When the conventional wearable device is charged, a magnetic attraction force between the magnetic charger 50' and the conventional wearable device is weaker, and an enough space is lacked to assemble the larger magnetic contacts 30' to enhance the magnetic attraction force.

Therefore, it is necessary to provide an innovative wearable device which is easy to adjust a magnetic strength of a magnetic charger.

BACKGROUND OF THE INVENTION

At least one specification heading is required. Please delete this heading section if it is not applicable to your application. For more information regarding the headings of the specification, please see MPEP 608.01(a).

SUMMARY OF THE INVENTION

An object of the present invention is to provide a wearable device which is easy to adjust a magnetic strength of a magnetic charger. The wearable device includes a housing, a main circuit board, two magnetic components and a battery. An inside of the housing has a ring-shaped accommodating space. The main circuit board is bent into a ring shape. The main circuit board is mounted in the accommodating space. The main circuit board includes a level section, a first curving section arched outward from one side of the level section, a second curving section arched outward and opposite to the first curving section from the other side of the level section, and two electrode contacts. A rear edge of a free side of the first curving section is recessed inward to form a notch. A rear edge of the first curving section is recessed inward to form a first reserving space. A rear edge of the second curving section is recessed inward to form a second reserving space. The first reserving space is located between the notch and the second reserving space. The two electrode contacts are slantwise extended downward and towards each other from two free sides of the first curving section and the second curving section. Two free sides of the two electrode contacts are spaced from each other. The two magnetic components are mounted in the accommodating space. Each magnetic component includes a magnet plate accommodated in the accommodating space, and a magnetic contact protruded inward from an inner surface of the magnet plate. The two magnetic contacts of the two magnetic components penetrate through an inner surface of the housing. The two electrode contacts are electrically connected with the two magnet plates of the two magnetic components. The first reserving space and the second reserving space accommodate two rears of the two magnet plates of the two magnetic components. The battery is accommodated in the accommodating space. The battery is received in the notch.

Another object of the present invention is to provide a wearable device. The wearable device is matched with a magnetic charger. The magnetic charger includes a shell, and two magnetic terminals disposed in the shell. The two magnetic terminals are exposed to the shell. The wearable device includes a housing, a main circuit board, two magnetic components and a battery. An inside of the housing has a ring-shaped accommodating space. The main circuit board is bent into a ring shape. The main circuit board is mounted in the accommodating space. The main circuit board includes a level section, a first curving section arched outward from one side of the level section, a second curving section arched outward and opposite to the first curving section from the other side of the level section, and two electrode contacts. A rear edge of a free side of the first curving section is recessed inward to form a notch. A rear edge of the first curving section is recessed inward to form a first reserving space. A rear edge of the second curving section is recessed inward to form a second reserving space. The first reserving space is located between the notch and the second reserving space. The two electrode contacts are slantwise extended downward and towards each other from two free sides of the first curving section and the second curving section. Two free sides of the two electrode contacts are spaced from each other. The two magnetic components are mounted in the accommodating space. Each magnetic component includes a magnet plate accommodated in the accommodating space, and a magnetic contact protruded inward from an inner surface of the magnet plate. The two magnetic contacts of the two magnetic components penetrate through an inner surface of the housing. The two electrode contacts are electrically connected with the two magnet plates of the two magnetic components. The first reserving space and the second reserving space accommodate two rears of the two magnet plates of the two magnetic components. The battery is accommodated in the accommodating space. The battery is received in the notch. The two magnetic terminals are attracted with the two magnetic contacts of the two magnetic components.

Another object of the present invention is to provide a wearable device matched with a magnetic charger. The magnetic charger includes a shell, and two magnetic terminals disposed in the shell. The two magnetic terminals are exposed to the shell. The wearable device includes a housing, a main circuit board, two magnetic components and a battery. An inside of the housing has a ring-shaped accommodating space. The main circuit board is bent into a ring shape. The main circuit board is mounted in the accommodating space. The main circuit board includes a level section, a first curving section arched outward from one side of the level section, a second curving section arched outward and opposite to the first curving section from the other side of the level section, and two electrode contacts. A rear edge of a free side of the first curving section is recessed inward to form a notch. A rear edge of the first curving section is recessed inward to form a first reserving space. A rear edge of the second curving section is recessed inward to form a second reserving space. The first reserving space is located between the notch and the second reserving space. The two electrode contacts are slantwise extended downward and towards each other from two free sides of the first curving section and the second curving section. Two free sides of the two electrode contacts are spaced from each other. The two magnetic components are mounted in the accommodating space. Each magnetic component includes a magnet plate accommodated in the accommodating space, and a magnetic contact protruded inward from an inner surface of the magnet plate. The two magnetic contacts of the two magnetic components penetrate through an inner surface of the housing. The two electrode contacts are electrically connected with the two magnet plates of the two magnetic components. The first reserving space and the second reserving space accommodate two rears of the two magnet plates of the two magnetic components. The battery is accommodated in the accommodating space. The battery is received in the notch. Widths of the two magnet plates of the two magnetic components are substantially equal to or larger than widths of the two magnetic contacts. The two magnetic terminals contact with the two magnetic components.

As described above, the rear edge of the free side of the first curving section is recessed inward to form the notch for accommodating the battery, the two rear edges of the first curving section and the second curving section are recessed inward to form the first reserving space and the second reserving space for accommodating the two rears of the two magnet plates of the two magnetic components, and the notch is staggered with the first reserving space and the second reserving space to prevent the battery interfering with the two magnet plates of the two magnetic components which are assembled in the first reserving space and the second reserving space. Furthermore, the two magnetic components are set to different widths according to different demands, so that the two magnetic components with the two magnet plates which have the different widths are chosen according to the different demands, so the wearable device is easy to adjust a magnetic strength of the magnetic charger.

BRIEF DESCRIPTION OF DRAWINGS

The present invention will be apparent to those skilled in the art by reading the following description, with reference to the attached drawings, in which.

DETAILED DESCRIPTION OF THE INVENTION

Figure 1:
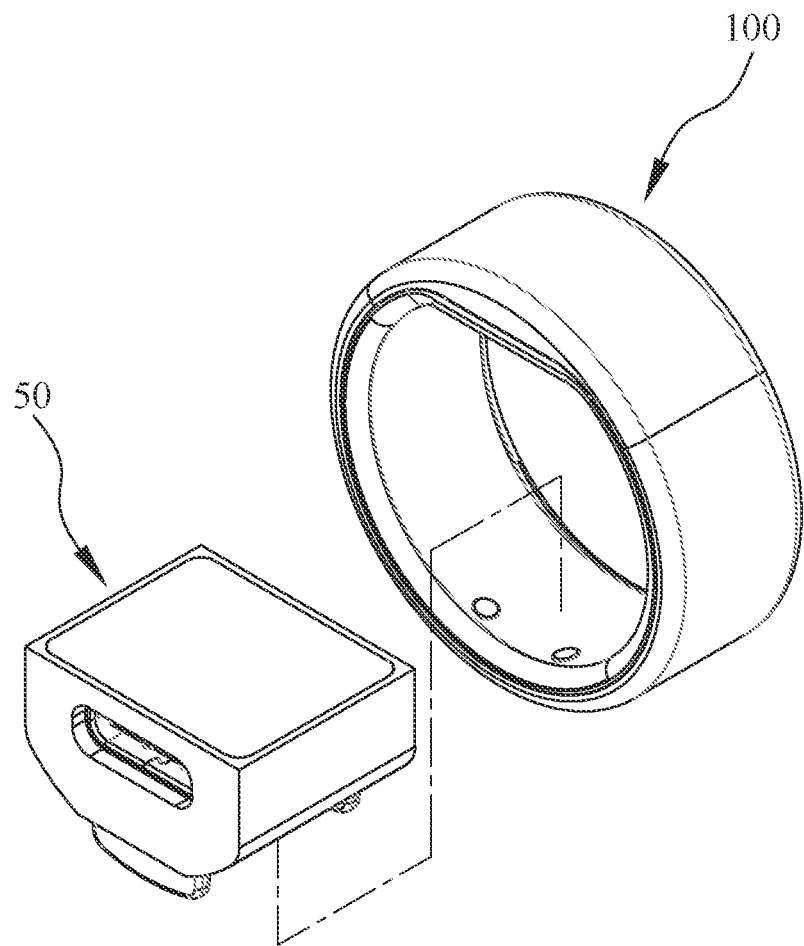
FIG. 1 is a perspective view of a wearable device in accordance with a first preferred embodiment of the present invention, wherein the wearable device is matched with a magnetic charger.
Figure 2:
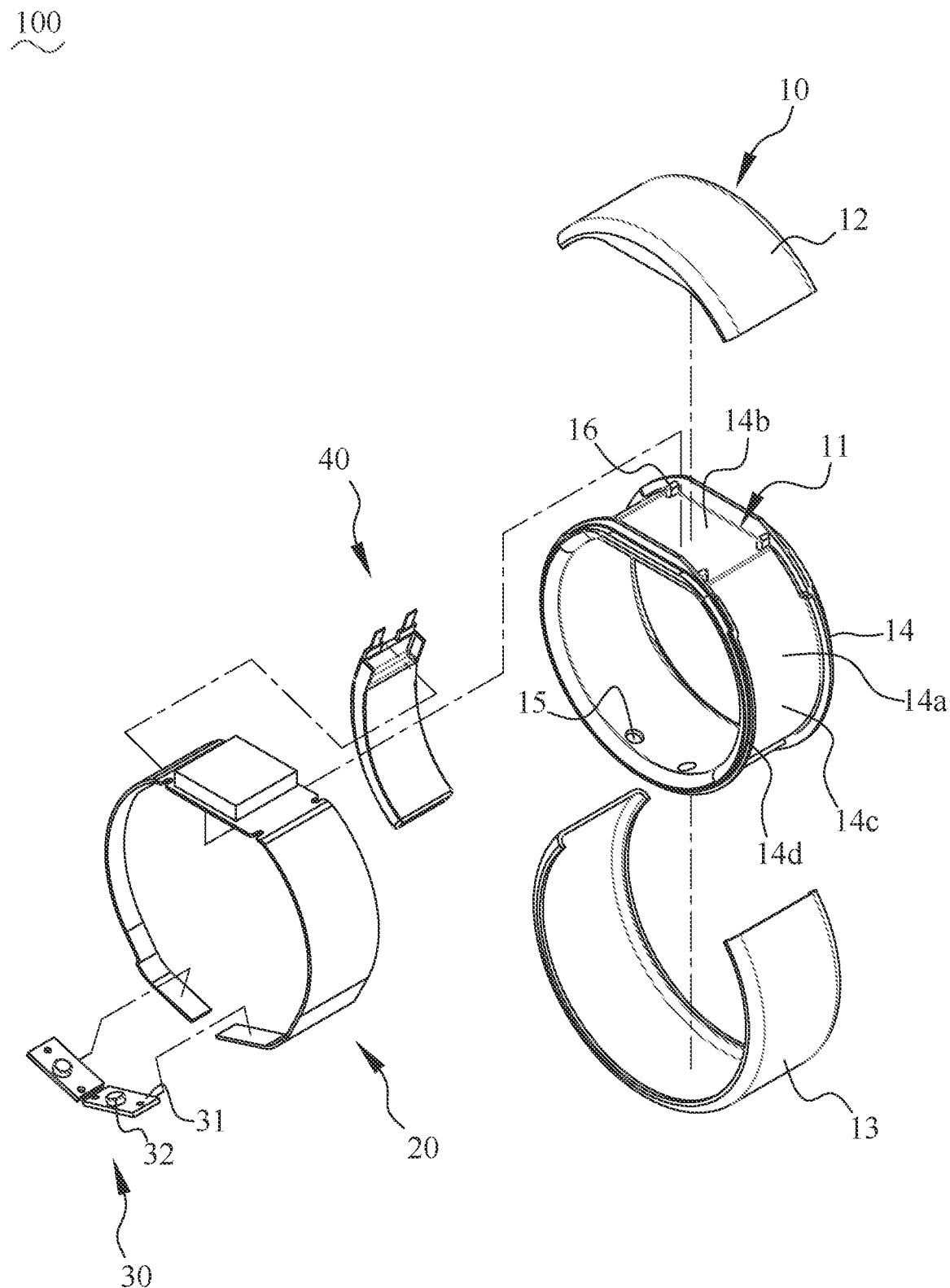
FIG. 2 is an exploded view of the wearable device of FIG. 1.

Referring to FIG. 1 and FIG. 2, a wearable device 100 in accordance with a first preferred embodiment of the present invention is shown. The wearable device 100 includes a housing 10, a main circuit board 20, two magnetic components 30 and a battery 40. The wearable device 100 is matched with a magnetic charger 50.

The wearable device 100 is provided as an annular shape, and the wearable device 100 is able to be worn around a body surface of a user. An inner surface of the wearable device 100 contacts with the body surface of the user when the wearable device 100 is worn by the user, and an outer surface of the wearable device 100 is opposite to the inner surface of the wearable device 100. Therefore, in order to describe conveniently, a term "an inward direction of the wearable device 100" in a following description content of the present invention is defined as a direction that is from the outer surface of the wearable device 100 to the inner surface of the wearable device 100, and a term "an outward direction of the wearable device 100" is defined as a direction that is from the inner surface of the wearable device 100 to the outer surface of the wearable device 100. The outward direction of the wearable device 100 is opposite to the inward direction of the wearable device 100.

An inside of the housing 10 has a ring-shaped accommodating space 11. The main circuit board 20 is bent into a ring shape. The main circuit board 20 is mounted in the accommodating space 11. Each magnetic component 30 includes a rectangular magnet plate 31 accommodated in the accommodating space 11, and a magnetic contact 32 protruded inward from an inner surface of the magnet plate 31. The two magnetic components 30 are mounted to an inner surface of the main circuit board 20. The main circuit board 20 and the two magnetic components 30 are mounted in the accommodating space 11. The two magnetic contacts 32 of the two magnetic components 30 penetrate through an inner surface of the housing 10. The battery 40 is accommodated in the accommodating space 11.

Figure 3:
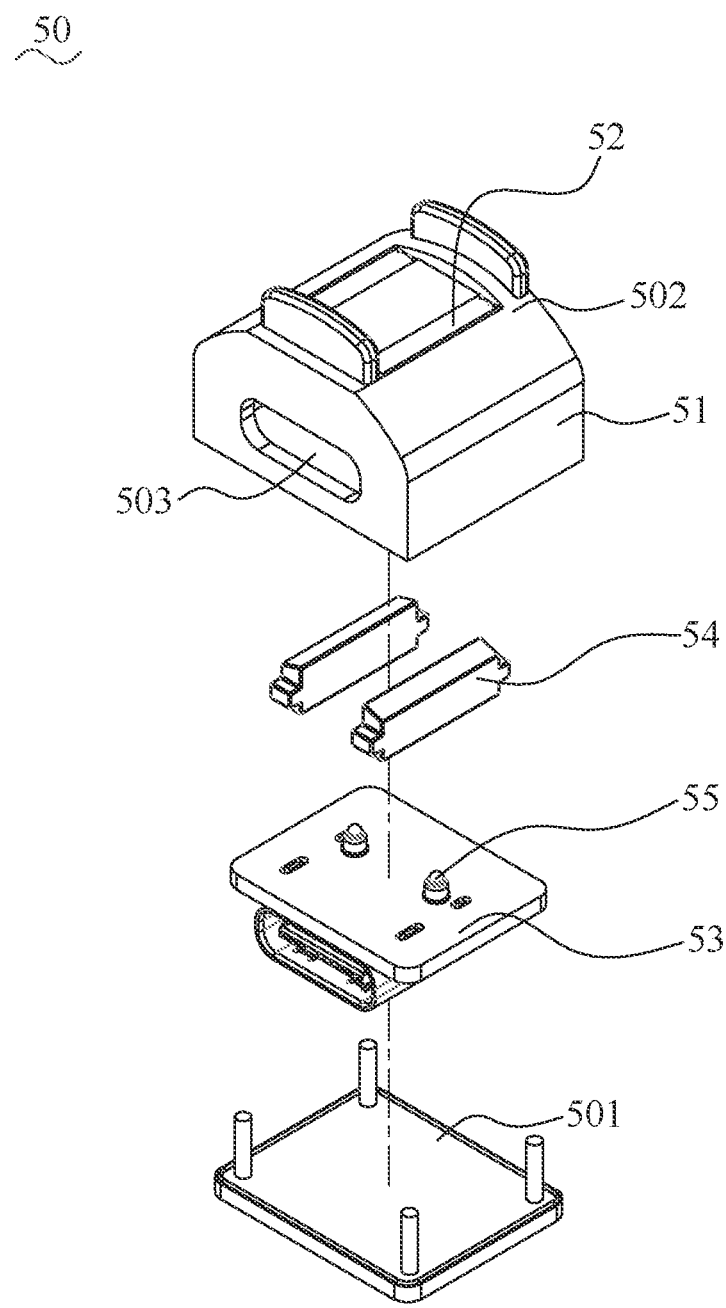
FIG. 3 is an exploded view of the magnetic charger of FIG. 1.

Referring to FIG. 1 and FIG. 3, the magnetic charger 50 charges the wearable device 100. The magnetic charger 50 includes a shell 51, a charging circuit board 53, two magnetic terminals 54 and two elastic elements 55. The two elastic elements 55 are conductive. An inside of the shell 51 has a receiving space 503 penetrating through a first wall 501 of the shell 51. Two sides of a second wall 502 of the shell 51 have two terminal slots 52 perpendicularly penetrating through the second wall 502 of the shell 51. The second wall 502 is opposite to the first wall 501. The charging circuit board 53 is mounted in the receiving space 503 of the inside of the shell 51 for controlling a voltage and a current which are outputted to the wearable device 100.

The two magnetic terminals 54 are disposed in the shell 51. The two magnetic terminals 54 are disposed in the two terminal slots 52, and the two magnetic terminals 54 are exposed to the second wall 502 of the shell 51. The two magnetic terminals 54 contact with the two magnetic components 30, and the two magnetic terminals 54 are combined with the two magnetic components 30. The two elastic elements 55 are connected between the charging circuit board 53 and the two magnetic terminals 54 to electrically connect the charging circuit board 53 and the two magnetic terminals 54. The charging circuit board 53 is conductive with the two magnetic terminals 54.

Referring to FIG. 2, in the first preferred embodiment, in order to assemble the wearable device 100 conveniently, the housing 10 includes an upper housing 12, a lower housing 13 and a ring bracket 14. The upper housing 12 is an arc shape. The lower housing 13 is a semicircle shape. The upper housing 12 is covered to an upper portion of the ring bracket 14, and the lower housing 13 is covered to a lower portion of the ring bracket 14. The upper housing 12 is combined with the lower housing 13 to form a circle shape. The ring bracket 14 is provided with an inner ring wall 14a and two radial walls 14d. The upper housing 12 is spaced from the inner ring wall 14a of the ring bracket 14. The lower housing 13 is spaced from the inner ring wall 14a of the ring bracket 14. The upper housing 12, the lower housing 13 and the ring bracket 14 surround the accommodating space 11 in the housing 10.

The inner ring wall 14a has a horizontal section 14b arranged at a top of the inner ring wall 14a, and a semicircular section 14c arched outward and towards each other from two sides of the horizontal section 14b. The two radial walls 14d are bent outward and are extended radially from two end peripheries of the inner ring wall 14a. A bottom of the inner ring wall 14a defines two through holes 15 penetrating through the bottom of the inner ring wall 14a. Several portions of a periphery of a top surface of the horizontal section 14b protrude upward to form a plurality of positioning bumps 16.

Figure 4:
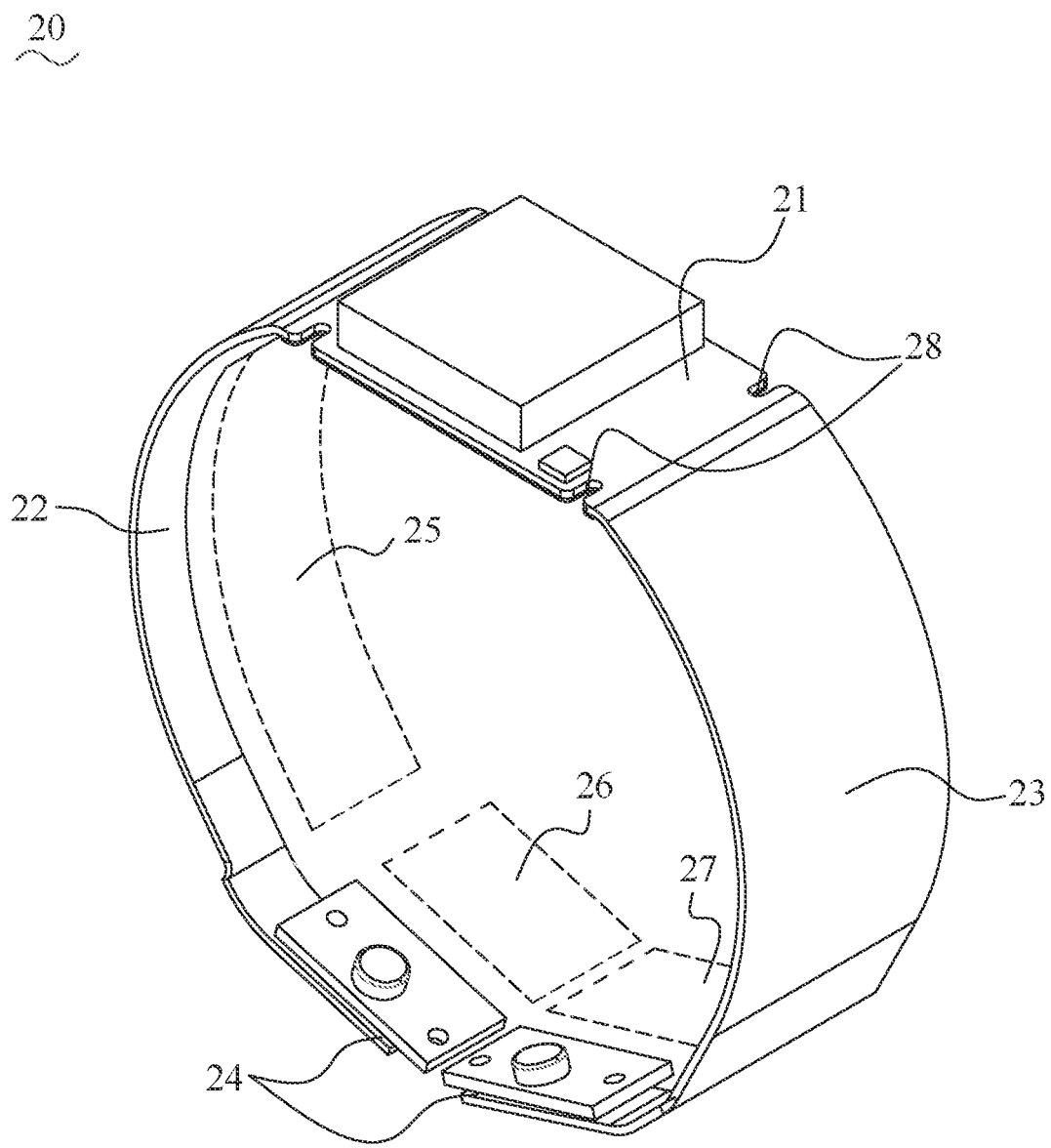
FIG. 4 is a perspective view of a circuit board in accordance with the first preferred embodiment of the present invention.
Figure 5:
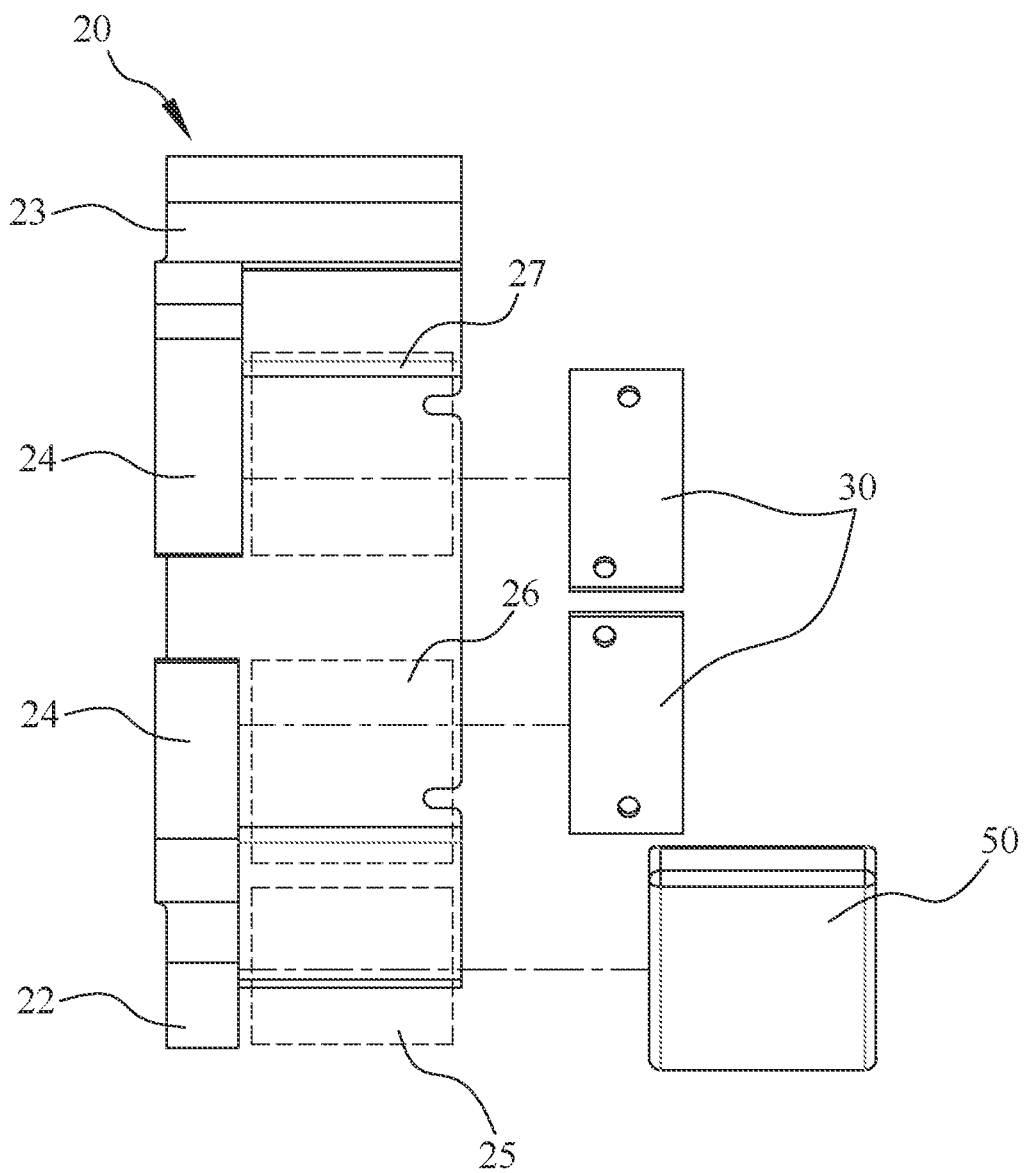
FIG. 5 is a partially exploded view of the wearable device in accordance with the first preferred embodiment of the present invention.

Referring to FIG. 2, FIG. 4 and FIG. 5, the main circuit board 20 includes a level section 21, a first curving section 22, a second curving section 23 and two electrode contacts 24. The first curving section 22 is arched outward from one side of the level section 21. The second curving section 23 is arched outward and opposite to the first curving section 22 from the other side of the level section 21. Two free sides of the first curving section 22 and the second curving section 23 are disconnected from each other. The two electrode contacts 24 are slantwise extended downward and towards each other from the two free sides of the first curving section 22 and the second curving section 23. Two free sides of the two electrode contacts 24 are spaced from each other.

The two magnetic components 30 are positioned at two inner surfaces of the two electrode contacts 24. The two magnet plates 31 of the two magnetic components 30 contact with the two inner surfaces of the two electrode contacts 24. The two electrode contacts 24 are electrically connected with the two magnet plates 31 of the two magnetic components 30. A rear edge of the free side of the first curving section 22 is recessed inward to form a notch 25 for accommodating the battery 40. The battery 40 is received in the notch 25. A rear edge of the first curving section 22 is recessed inward to form a first reserving space 26. A rear edge of the second curving section 23 is recessed inward to form a second reserving space 27. The first reserving space 26 and the second reserving space 27 accommodate two rears of the two magnet plates 31 of the two magnetic components 30. The first reserving space 26 is located between the notch 25 and the second reserving space 27. The notch 25 is staggered with the first reserving space 26 and the second reserving space 27 to prevent the battery 40 interfering with the two magnet plates 31 of the two magnetic components 30 which are assembled in the first reserving space 26 and the second reserving space 27. Several portions of a front edge and a rear edge of the level section 21 are recessed inward to form a plurality of positioning holes 28 penetrating through a top surface and a bottom surface of the level section 21. The plurality of the positioning holes 28 are arranged corresponding to the plurality of the positioning bumps 16.

Referring to FIG. 1 to FIG. 6, when the wearable device 100 is assembled, the plurality of the positioning holes 28 are aligned with the plurality of the positioning bumps 16, and the plurality of the positioning bumps 16 are fixed in the plurality of the positioning holes 28. Then the level section 21 is horizontally placed on the horizontal section 14b to fasten the main circuit board 20 to the ring bracket 14. The level section 21, the first curving section 22 and the second curving section 23 are accommodated into the accommodating space 11. The battery 40 is inserted into the notch 25, and the battery 40 is electrically connected with the main circuit board 20. The two magnetic contacts 32 penetrate through the two through holes 15. The two magnet plates 31 of the two magnetic components 30 are adhered with the two electrode contacts 24 by a conductive adhesive to make that the two magnetic components 30 are electrically connected with the main circuit board 20.

Referring to FIG. 1 and FIG. 3, when the user wants to charge the wearable device 100, the user places the magnetic charger 50 inside the wearable device 100, the two magnetic terminals 54 are attracted with the two magnetic contacts 32 of the two magnetic components 30, and the two magnetic terminals 54 are aligned with the two magnetic contacts 32 of the two magnetic components 30 to make that the magnetic charger 50 is magnetically attracted to the wearable device 100, and an electrical conduction is formed between the wearable device 100 and the magnetic charger 50.

Figure 6:
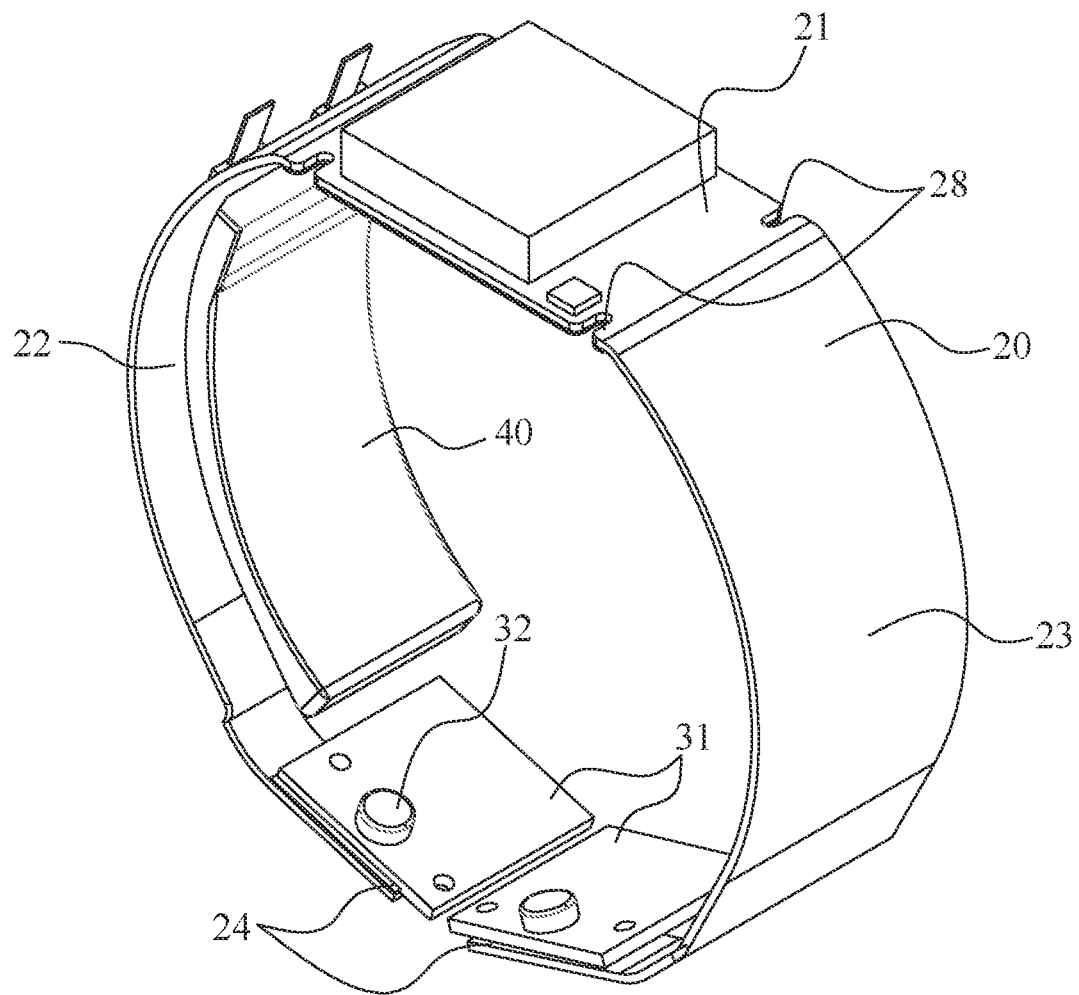
FIG. 6 is a partial assembling view of the wearable device in accordance with a second preferred embodiment of the present invention.
Figure 7:
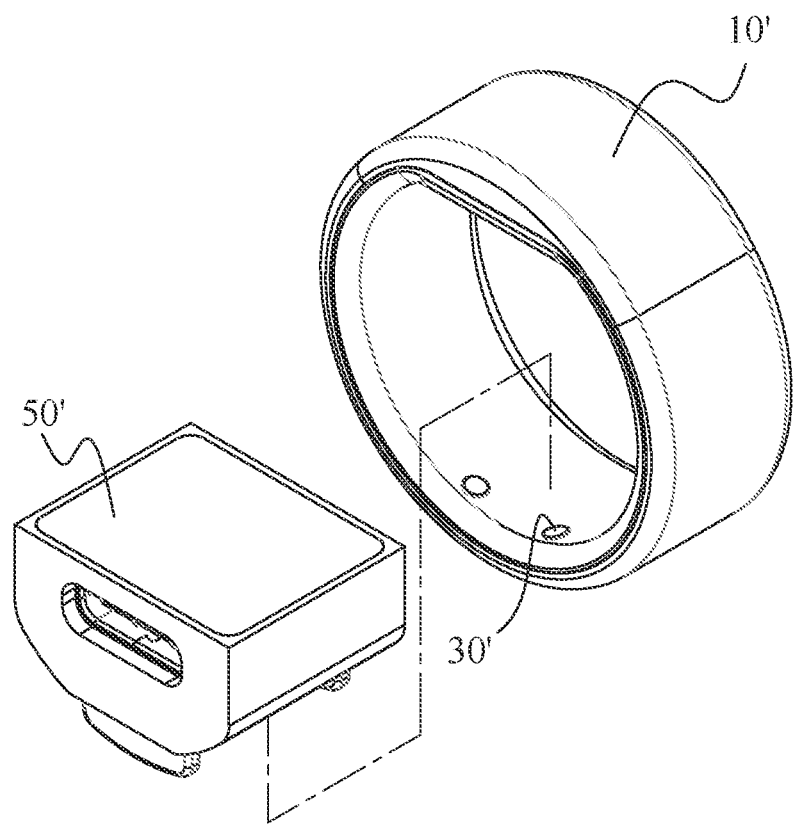
FIG. 7 is a perspective view of a conventional wearable device in prior art, wherein the conventional wearable device is matched with a conventional magnetic charger.
Figure 8:
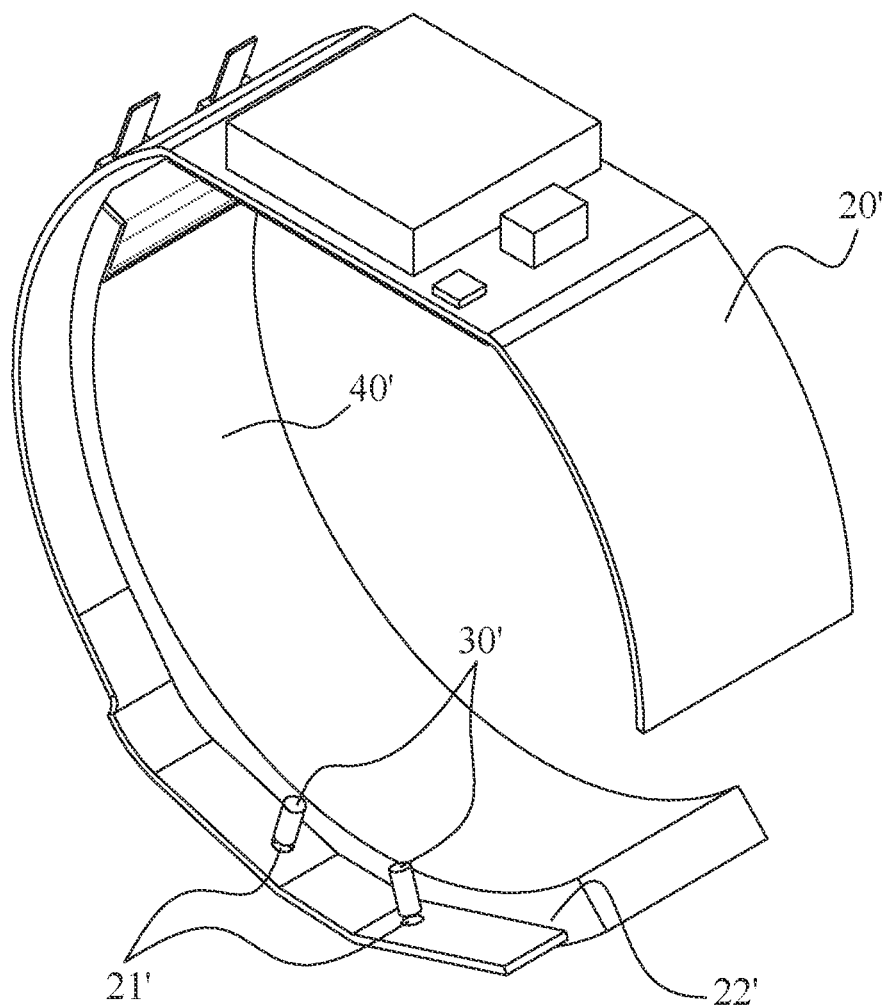
FIG. 8 is a perspective view of a circuit board of the conventional wearable device of FIG. 7.

Referring to FIG. 1, FIG. 5 and FIG. 6, the wearable device 100 in accordance with a second preferred embodiment of the present invention is shown. Differences between the wearable device 100 in accordance with the first preferred embodiment of the present invention and the wearable device 100 in accordance with the second preferred embodiment of the present invention are described as follows. In the first preferred embodiment, widths of the two magnet plates 31 of the two magnetic components 30 are substantially equal to widths of the two magnetic contacts 32. In the second preferred embodiment, the widths of the two magnet plates 31 of the two magnetic components 30 are larger than the widths of the two magnetic contacts 32. Partial portions of the two magnet plates 31 of the two magnetic components 30 are received in the first reserving space 26 and the second reserving space 27, so the two magnet plates 31 of the two magnetic components 30 have larger contact areas, and a greater attraction force is generated between the two magnet plates 31 of the two magnetic components 30 and the two magnetic terminals 54 of the magnetic charger 50.

Referring to FIG. 1 to FIG. 6, in the present invention, the widths of the two magnet plates 31 of the two magnetic components 30 are adjustable, the widths of the two magnet plates 31 of the two magnetic components 30 are substantially equal to or larger than the widths of the two magnetic contacts 32, so a magnetic strength between the magnetic charger 50 and the wearable device 100 is easily adjusted.

As described above, the rear edge of the free side of the first curving section 22 is recessed inward to form the notch 25 for accommodating the battery 40, the two rear edges of the first curving section 22 and the second curving section 23 are recessed inward to form the first reserving space 26 and the second reserving space 27 for accommodating the two rears of the two magnet plates 31 of the two magnetic components 30, and the notch 25 is staggered with the first reserving space 26 and the second reserving space 27 to prevent the battery 40 interfering with the two magnet plates 31 of the two magnetic components 30 which are assembled in the first reserving space 26 and the second reserving space 27. Furthermore, the two magnetic components 30 are set to different widths according to different demands, so that the two magnetic components 30 with the two magnet plates 31 which have the different widths are chosen according to the different demands, so the wearable device 100 is easy to adjust the magnetic strength of the magnetic charger 50.

What is claimed is:

1. A wearable device, comprising:
   a housing, an inside of the housing having a ring-shaped accommodating space;
   a main circuit board bent into a ring shape, the main circuit board being mounted in the accommodating space, the main circuit board including:
   a level section;
   a first curving section arched outward from one side of the level section, a rear edge of a free side of the first curving section being recessed inward to form a notch, a rear edge of the first curving section being recessed inward to form a first reserving space;
   a second curving section arched outward and opposite to the first curving section from the other side of the level section, a rear edge of the second curving section being recessed inward to form a second reserving space, the first reserving space being located between the notch and the second reserving space; and
   two electrode contacts slantwise extended downward and towards each other from two free sides of the first curving section and the second curving section, two free sides of the two electrode contacts being spaced from each other;
   two magnetic components mounted in the accommodating space, each magnetic component including a magnet plate accommodated in the accommodating space, and a magnetic contact protruded inward from an inner surface of the magnet plate, the two magnetic contacts of the two magnetic components penetrating through an inner surface of the housing, the two electrode contacts being electrically connected with the two magnet plates of the two magnetic components, the first reserving space and the second reserving space accommodating two rears of the two magnet plates of the two magnetic components; and
   a battery accommodated in the accommodating space, the battery being received in the notch.

2. The wearable device as claimed in claim 1, wherein the housing includes an upper housing, a lower housing and a ring bracket, the upper housing is an arc shape, the lower housing is a semicircle shape, the upper housing is covered to an upper portion of the ring bracket, and the lower housing is covered to a lower portion of the ring bracket, the upper housing is combined with the lower housing to form a circle shape, the upper housing, the lower housing and the ring bracket surround the accommodating space in the housing.

3. The wearable device as claimed in claim 2, wherein the ring bracket being provided with an inner ring wall and two radial walls, the inner ring wall has a horizontal section arranged at a top of the inner ring wall, and a semicircular section arched outward and towards each other from two sides of the horizontal section, the two radial walls are bent outward and are extended radially from two end peripheries of the inner ring wall, a bottom of the inner ring wall defines two through holes penetrating through the bottom of the inner ring wall, the two magnetic contacts penetrate through the two through holes.

4. The wearable device as claimed in claim 3, wherein several portions of a periphery of a top surface of the horizontal section protrude upward to form a plurality of positioning bumps, several portions of a front edge and a rear edge of the level section are recessed inward to form a plurality of positioning holes penetrating through a top surface and a bottom surface of the level section, the plurality of the positioning holes are arranged corresponding to the plurality of the positioning bumps, the plurality of the positioning bumps are fixed in the plurality of the positioning holes.

5. The wearable device as claimed in claim 1, wherein widths of the two magnet plates of the two magnetic components are substantially equal to widths of the two magnetic contacts.

6. The wearable device as claimed in claim 1, wherein widths of the two magnet plates of the two magnetic components are larger than widths of the two magnetic contacts, partial portions of the two magnet plates of the two magnetic components are received in the first reserving space and the second reserving space.

7. The wearable device as claimed in claim 1, wherein the notch is staggered with the first reserving space and the second reserving space.

8. A wearable device matched with a magnetic charger, the magnetic charger including a shell, and two magnetic terminals disposed in the shell, the two magnetic terminals being exposed to the shell, the wearable device comprising:
   a housing, an inside of the housing having a ring-shaped accommodating space;
   a main circuit board bent into a ring shape, the main circuit board being mounted in the accommodating space, the main circuit board including:
   a level section;
   a first curving section arched outward from one side of the level section, a rear edge of a free side of the first curving section being recessed inward to form a notch, a rear edge of the first curving section being recessed inward to form a first reserving space;
   a second curving section arched outward and opposite to the first curving section from the other side of the level section, a rear edge of the second curving section being recessed inward to form a second reserving space, the first reserving space being located between the notch and the second reserving space; and
   two electrode contacts slantwise extended downward and towards each other from two free sides of the first curving section and the second curving section, two free sides of the two electrode contacts being spaced from each other;
   two magnetic components mounted in the accommodating space, each magnetic component including a magnet plate accommodated in the accommodating space, and a magnetic contact protruded inward from an inner surface of the magnet plate, the two magnetic contacts of the two magnetic components penetrating through an inner surface of the housing, the two electrode contacts being electrically connected with the two magnet plates of the two magnetic components, the first reserving space and the second reserving space accommodating two rears of the two magnet plates of the two magnetic components; and a battery accommodated in the accommodating space, the battery being received in the notch;

wherein the two magnetic terminals are attracted with the two magnetic contacts of the two magnetic components.

9. A wearable device matched with a magnetic charger, the magnetic charger including a shell, and two magnetic terminals disposed in the shell, the two magnetic terminals being exposed to the shell, the wearable device comprising:

a housing, an inside of the housing having a ring-shaped accommodating space;

a main circuit board bent into a ring shape, the main circuit board being mounted in the accommodating space, the main circuit board including:

a level section;

a first curving section arched outward from one side of the level section, a rear edge of a free side of the first curving section being recessed inward to form a notch, a rear edge of the first curving section being recessed inward to form a first reserving space;

a second curving section arched outward and opposite to the first curving section from the other side of the level section, a rear edge of the second curving section being recessed inward to form a second reserving space, the first reserving space being located between the notch and the second reserving space; and two electrode contacts slantwise extended downward and towards each other from two free sides of the first curving section and the second curving section, two free sides of the two electrode contacts being spaced from each other;

two magnetic components mounted in the accommodating space, each magnetic component including a magnet plate accommodated in the accommodating space, and a magnetic contact protruded inward from an inner surface of the magnet plate, the two magnetic contacts of the two magnetic components penetrating through an inner surface of the housing, the two electrode contacts being electrically connected with the two magnet plates of the two magnetic components, the first reserving space and the second reserving space accommodating two rears of the two magnet plates of the two magnetic components; and a battery accommodated in the accommodating space, the battery being received in the notch;

wherein widths of the two magnet plates of the two magnetic components are substantially equal to or larger than widths of the two magnetic contacts, the two magnetic terminals contact with the two magnetic components.

\* \* \* \* \*